United States Patent
Sugihara

(10) Patent No.: US 9,735,990 B2
(45) Date of Patent: Aug. 15, 2017

(54) SOFT DECISION VALUE GENERATING APPARATUS AND METHOD OF GENERATING SOFT DECISION VALUE

(71) Applicant: MITSUBISHI ELECTRIC CORPORATION, Tokyo (JP)

(72) Inventor: Kenya Sugihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/116,133

(22) PCT Filed: Oct. 10, 2014

(86) PCT No.: PCT/JP2014/077230
§ 371 (c)(1),
(2) Date: Aug. 2, 2016

(87) PCT Pub. No.: WO2015/125341
PCT Pub. Date: Aug. 27, 2015

(65) Prior Publication Data
US 2017/0134193 A1    May 11, 2017

(30) Foreign Application Priority Data
Feb. 24, 2014    (JP) ................. 2014-033108

(51) Int. Cl.
*H04L 25/06*    (2006.01)
*H04L 27/38*    (2006.01)
(Continued)

(52) U.S. Cl.
CPC ....... *H04L 25/067* (2013.01); *H03M 13/1108* (2013.01); *H03M 13/1111* (2013.01);
(Continued)

(58) Field of Classification Search
CPC .............. H03M 13/1111; H03M 13/45; H03M 13/1108; H04L 25/067; H04L 1/0054; H04L 27/38
See application file for complete search history.

(56) References Cited

U.S. PATENT DOCUMENTS 9,184,954 B1 *  11/2015  Alhussien ............ H03M 13/114
9,432,053 B1 *   8/2016  Graumann .......... H03M 13/1111
(Continued)

FOREIGN PATENT DOCUMENTS

| JP | 2002-330188 A | 11/2002 |
| JP | 2007-174057 A | 7/2007 |
| WO | WO 2012/070369 A1 | 5/2012 |

OTHER PUBLICATIONS

Sugihara et al., "A Method of Calculating Log-Likelihood Ratio with Hard Decision Feedbacks for Multilevel Modulations", NII-Electronic Library Service, Mar. 20-23, 2012, p. 158.
(Continued)

*Primary Examiner* — Jean B Corrielus
(74) *Attorney, Agent, or Firm* — Birch, Stewart, Kolasch & Birch, LLP

(57) ABSTRACT

There are provided a hard decision value calculator that calculates hard decision values from I-ch and Q-ch coordinates of a received symbol having been subjected to multi-level modulation, and an LLR calculator that approximately calculates LLRs from the I-ch and Q-ch coordinates of the received symbol. In a case where a sign bit of an LLR calculated by the LLR calculator conflicts with a hard decision value calculated by the hard decision value calculator, an LLR corrector inverts the sign bit of the LLR and outputs the sign-bit-inverted LLR as a soft decision value to an error correction decoder.

9 Claims, 6 Drawing Sheets

(51) Int. Cl.
*H04L 1/00* (2006.01)
*H03M 13/45* (2006.01)
*H03M 13/11* (2006.01)

(52) U.S. Cl.
CPC .......... *H03M 13/45* (2013.01); *H04L 1/0054* (2013.01); *H04L 27/38* (2013.01)

(56) References Cited

U.S. PATENT DOCUMENTS

2002/0159535 A1 10/2002 Agami et al.
2007/0162836 A1 7/2007 Orio
2013/0205184 A1 8/2013 Nishimoto et al.

OTHER PUBLICATIONS

Tosato et al., "Simplified Soft-Output Demapper for Binary Interleaved COFDM with Application to HIPERLAN/2", ICC'02, vol. 2, Apr.-May 2002, pp. 664-668.

* cited by examiner

SOFT DECISION VALUE GENERATING APPARATUS AND METHOD OF GENERATING SOFT DECISION VALUE

TECHNICAL FIELD

The invention relates to a soft decision value generating apparatus and a method of generating soft decision values, each of which calculates ratios to be used for soft decision decoding.

BACKGROUND ART

A digital communication system uses error correction codes when correcting errors in data which occur due to, for example, influence of noise received in a communication path.

The error correction codes are implemented by error correction encoding at the transmitter side and error correction decoding at the receiver side. The error correction decoding can be broadly classified into two types: one is called as hard decision decoding and the other is called as soft decision decoding.

Digital data transmitted in the digital communication system is composed of bit information of "0" or "1". When performing hard decision decoding., a binary decision is made to decide that a value of each bit of digital data is "0" or "1" by comparing the value of each bit with as threshold value. The hard decision decoding of the digital data is performed by using hard decision values which are the results of the decision.

On the other hand, when performing, soft decision decoding, instead of performing a binary decision of "0" or "1", soft decision values indicating the probability of "0" or "1", likelihood, or log-likelihood ratio (LLR) are calculated. The soft decision decoding of the digital data is performed by using the soft decision values.

The soft decision decoding has a strong error correction capability compared to the hard decision decoding. For codes to be used together with soft decision decoding, there are turbo codes and LDPC (Low-Density Parity-Check) codes.

Soft decision values are generated, from a received symbol being received data, depending on a digital modulation scheme of a transmission symbol being transmission data.

When the digital modulation scheme used in the digital communication system is a multilevel modulation scheme, e.g., PSK (Phase Shift Keying), APSK (Amplitude Phase Shift Keying), or QAM (Quadrature amplitude modulation), one transmission symbol is composed of a plurality of bits.

Assuming that an LLR being a log-likelihood ratio of a k-th bit of a transmission symbol is "$L_k$", this $L_k$ can be calculated by the following equation (1):

$$L_k = \ln \sum_{s_i \in C_{k,0}} \exp\left(-\frac{|r - s_i|^2}{2\sigma^2}\right) - \ln \sum_{s_i \in C_{k,1}} \exp\left(-\frac{|r - s_i|^2}{2\sigma^2}\right) \quad (1)$$

In the equation (1), "r" denotes the position vector (I coordinate and Q coordinate) of a received symbol (a received signal point), "$s_i$" denotes the position vector of the transmission symbol (a transmission signal point), "$C_{k,0}$" denotes a set of all transmission symbol points each of whose k-th bit is "0", "$C_{k,1}$" denotes a set of all transmission symbol points each of whose k-th bit is "1", and "σ" denotes the standard deviation of Gaussian noise in a communication path.

Calculation of an LLR by the equation (1) requires to compute a plurality of exponential functions "exp" before adding, up computation results of the exponential functions "exp", and to further compute a logarithmic function "ln" for the result of the addition. Accordingly, the amount of computation may become enormous.

Therefore, it is not realistic to implement the computation of an LLR by the equation (1) by a circuit, in terms of circuit size.

The following Non-Patent Literature 1 discloses an LLR approximate computation technique in which only a maximum value among the computation results of the exponential functions "exp" in the equation (1) is used while other values of the computation results are ignored.

The following equation (2) is a calculation expression for "$L_k$" by the above-described approximate computation technique:

$$\begin{aligned} L_k &= \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right) \\ &\approx \ln \max_{s_j \in C_{k,0}} \exp\left(-\frac{|r-s_i|^2}{2\sigma^2}\right) - \ln \max_{s_i \in C_{k,1}} \exp\left(-\frac{|r-s_i|^2}{2\sigma^2}\right) \\ &= \frac{-|r - s_{k,0,min}|^2 + |r - s_{k,1,min}|^2}{2\sigma^2} := L_{1,k} \end{aligned} \quad (2)$$

In equation (2), "$S_{k,0,min}$" denotes the position vector of a transmission symbol point that is closest to the received signal point "r" among the transmission symbol points each of whose k-th bit is "0", and "$S_{k,1,min}$" denotes the position vector of a transmission symbol point that is closest to the received signal point "r" among the transmission symbol points each of whose k-th bit is "1".

In addition, the following Patent Literature I discloses a method of efficiently calculating LLRs by using symmetry of mapping in gray-mapped QAM based on the LLR approximate computation technique disclosed in the Non-Patent Literature 1.

However, the method disclosed in Patent Literature 1 is a method only applicable to gray-mapped ones, and there is no known gray-mapping with excellent characteristics for QAM having an odd power of 2 number of modulation levels such as 32QAM and 128QAM.

In general, in QAM whose number of modulation levels is an even power of 2 and which is known for its gray mapping with excellent characteristics, the LLR of each bit depends on only an I-ch (in-phase component) coordinate or a Q-ch (quadrature component) coordinate. Therefore, LLRs with high approximation accuracy can be calculated with a relatively small amount of computation.

On the other hand, in QAM or APSK, etc., whose numbers of modulation levels are an odd power of 2, the LLR of each bit depends on both of the I-ch coordinate and the Q-ch coordinate. Therefore, calculation of LLRs with high approximation accuracy requires a large amount of computation.

Meanwhile, when a modulation symbol is differentially encoded, modulation schemes, such as differential encoding QPSK or differential encoding QAM, may be used.

In these modulation schemes, demodulation is possible by a receiver performing differential detection, and in general, coherent detection is not required. Note, however, that by the receiver performing coherent detection, higher reception performance than that exerted when differential detection is performed can be exerted.

In a modulation scheme where a modulation symbol is differentially encoded, assuming that the LLR of a differentially encoded k-th bit is "$L_k$", this $L_k$ can be calculated by the following equation (3):

$$L_k = \ln \sum_{(q_i, q_j) \in D_{k,0}} \left[ \frac{1}{2\pi\sigma^2} \exp\left(-\frac{|r_1 - q_i|^2}{2\sigma^2}\right) \exp\left(-\frac{|r_2 - q_j|^2}{2\sigma^2}\right) \right] - \ln \sum_{(q_i, q_j) \in D_{k,1}} \left[ \frac{1}{2\pi\sigma^2} \exp\left(-\frac{|r_1 - q_i|^2}{2\sigma^2}\right) \exp\left(-\frac{|r_2 - q_j|^2}{2\sigma^2}\right) \right] \quad (3)$$

In equation (3), "r1" denotes the position vector of a reference symbol (i.e., a received symbol which has been received one time previous to the present time), "r2" denotes the position vector of the received symbol at the present time, and "$D_{k,1}$" denotes a set of pairs of transmission symbols (qi, qi) (i.e., pairs of a reference symbol at the time of transmission and a received symbol at the present time) each of whose k-th bit before differential encoding is "1" (1+0, 1).

In addition, the following Patent Literature 2 discloses a method of efficiently calculating LLRs when a modulation scheme is differential encoding QPSK.

However, a method of calculating LLRs for differential encoding multilevel modulation is not disclosed.

Patent Literature 1: JP 2002-330188 A

Patent Literature 2: WO 2012/070369 A

Non-Patent Literature 1 : F. Tosato and P. Bisaglia, "Simplified soft-output demapper for binary interleaved COFDM with application to HIPERLAN/2," in Proc. Int, Conf. Commun., Sep. 2002, pp. 664-668.

SUMMARY OF INVENTION

Since a conventional soft decision value generating apparatus is configured in the above-described manner, in the case of Patent Literature 1, if a modulation scheme is gray-mapped QAM, the amount of computation for LLRs can be reduced. However, since it is used for calculating approximate values of LLRs, there is a problem of causing degradation in accuracy of LLRs.

In addition, in a modulation scheme involving differential encoding, there is a problem that calculation of LLRs requires a large amount of computation.

The invention is made to solve problems such as those described above, and an object of the invention is to obtain a soft decision value generating apparatus and a method of generating soft decision values, which are capable of calculating LLRs having high approximation accuracy through a small amount of computation.

In addition, a further object of the invention is to obtain a soft decision value generating apparatus and a method of generating soft decision values, which are capable of calculating LLRs having high approximation accuracy through a small amount of computation, even when a modulation scheme involving differential encoding is used.

A soft decision value generating apparatus according to one aspect of the invention is provided with: a hard decision value calculator to calculate hard decision values from coordinates of a received symbol having been subjected to multilevel modulation; an approximate value calculator to calculate, from the coordinates of the received symbol, approximate values of log-likelihood ratios to be used for soft decision decoding; and an approximate value corrector to invert a sign bit of an approximate value calculated by the approximate value calculator in a case where the sign bit of the approximate value conflicts with a hard decision value calculated by the hard decision value calculator, and to output the sign-bit-inverted approximate value as a soft decision value.

According to the invention, there are provided a hard decision value calculator to calculate hard decision values from coordinates of a received symbol having been subjected to multilevel modulation, an approximate value calculator to calculate, from the coordinates of the received symbol, approximate values of log-likelihood ratios to be used for soft decision decoding: and an approximate value corrector to invert a sign bit of an approximate value calculated by the approximate value calculator in a case where the sign bit of the approximate value conflicts with a hard decision value calculated by the hard decision value calculator, and to output the sign-bit-inverted approximate value as a soft decision value. Therefore, there is an effect that LLRs having high approximation accuracy can be calculated with a small amount of computation.

DESCRIPTION OF EMBODIMENTS

In order to describe the invention in more detail, embodiments of carrying out the invention will be described below with reference to the accompanying drawings.

(Embodiment 1)

Figure 1:
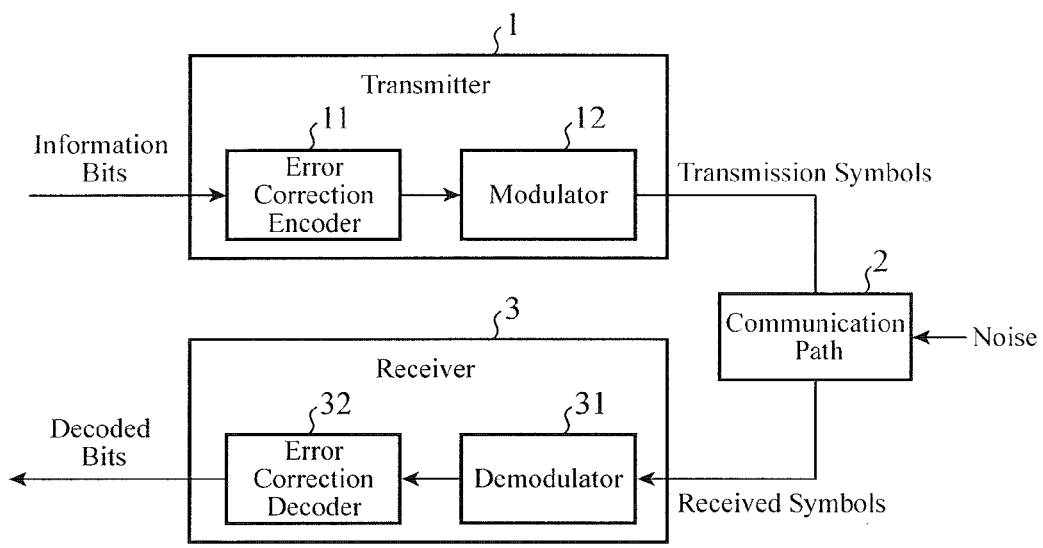
FIG. 1 is a configuration diagram representing a communication system to which a soft decision value generating apparatus according to Embodiment 1 of the invention is applied.

FIG. 1 is a configuration diagram representing a communication system to which a soft decision value generating apparatus according to Embodiment 1 of the invention is applied.

In FIG. 1, a transmitter 1 is composed of an error correction encoder 11 and a modulator 12. The transmitter 1 generates transmission symbols from a sequence of information bits (hereinafter, referred to as an "information bit sequence") representing information to be transmitted, and transmits the transmission symbols to a receiver 3 through a communication path 2.

The error correction encoder 11 performs a process of generating a bit sequence called parity bits (hereinafter, referred to as a "parity bit sequence") from an information bit sequence, and outputting the information bit sequence and the parity bit sequence.

The modulator 12 performs a process of determining, in accordance with a rule provided by a specified modulation scheme for multilevel modulation, coordinates (I-ch and Q-ch coordinates) on a two-dimensional plane composed of I-ch (in-phase components) and Q-ch (quadrature components) which correspond to the information bit sequence and the parity bit sequence output from the error correction encoder 11, and mapping transmission symbols onto the determined coordinates.

The transmission symbols are not limited to so-called, electrical signals and may be optical signals or radio waves, etc.

The transmission symbols are transmitted to the receiver 3 through the communication path 2. However, since the transmission symbols is influenced by noise in the communication path 2, coordinates of received symbols received by the receiver 3 may vary from coordinates of the transmission symbols.

The receiver 3 is composed of a demodulator 31 and an error correction decoder 32. When a received symbol influenced by noise in the communication path 2 is received, the receiver 3 corrects an information bit sequence having an error, and outputs the error-corrected information bit sequence (i.e., decoded bits).

Figure 2:
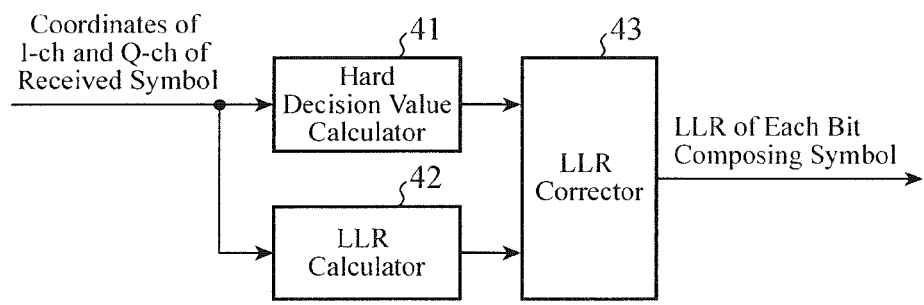
FIG. 2 is a configuration diagram representing the soft decision value generating apparatus according to the Embodiment 1 of the invention.

The demodulator 31 has a soft decision value generating apparatus of FIG. 2 mounted thereon. The demodulator 31 performs a process of calculating, from the I-ch and Q-ch coordinates of the received symbol, an LLR (Log-Likelihood Ratio) which is a log-likelihood ratio of each of bits composing the received symbol.

It is assumed here that the demodulator 31 has the soft decision value generating apparatus, but the demodulator 31 may have for example, an equalizer, etc., mounted thereon, in addition to the soft decision value generating apparatus. The equalizer or the like, are often installed at a previous stage to the soft decision value generating apparatus.

The error correction decoder 32 performs soft decision decoding using the LLRs calculated by the demodulator 31, and outputs an error-corrected information bit sequence (i.e., decoded bits) which is the results of the decoding.

FIG. 2 is a configuration diagram representing the soft decision value generating apparatus according to the Embodiment 1 of the invention.

In FIG. 2, a bard decision value calculator 41 performs a process of calculating hard decision values from the I-ch and Q-ch coordinates of a received symbol. The hard decision value calculator 41 corresponds to the claimed hard decision value calculator.

An LLR calculator 42 performs a process of approximately calculating, from the I-ch and Q-ch coordinates of the received symbol, LLRs to be used for soft decision decoding. Namely, a process of calculating approximate values of LLRs from the I-ch and Q-ch coordinates is performed. The LLR calculator 42 corresponds to the claimed approximate value calculator.

An LLR corrector 43 performs a process of inverting a sign bit of the LLR calculated by the LLR calculator 42 in a case where the sign bit of the LLR conflicts with a hard decision value calculated by the hard decision value calculator 41, and outputting the sign-bit-inverted LLR as a soft decision value to the error correction decoder 32. The LLR corrector 43 corresponds to the claimed approximate value corrector.

Although, in an example represented by FIG. 2, it is assumed that each of the hard decision value calculator 41, the LLR calculator 42, and the LLR corrector 43, each of which is a component of the soft decision value generating apparatus, is composed of dedicated hardware (e.g., a semiconductor integrated circuit having a CPU mounted thereon, or a one-chip microcomputer), the soft decision value generating apparatus may be composed of a computer.

If the soft decision value generating apparatus is composed of a computer, a program describing the processing contents of the hard decision value calculator 41, the LLR calculator 42, and the LLR corrector 43 are stored in a memory of the computer, and a CPU of the computer executes the program stored in the memory.

Figure 3:
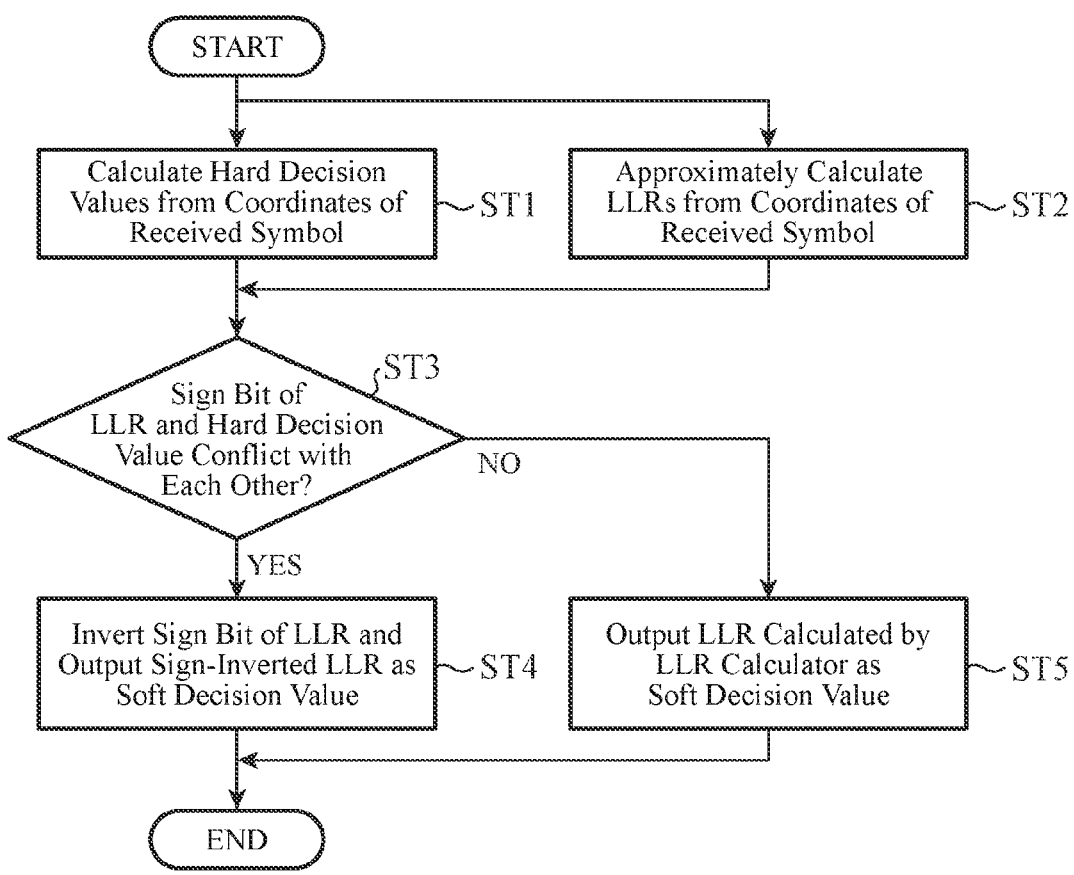
FIG. 3 is a flowchart representing the processing content of the soft decision value generating apparatus (or a method of generating soft decision values) according to the Embodiment 1 of the invention.

FIG. 3 is a flowchart representing the processing content of the soft decision value generating apparatus (or a method of generating soft decision values) according to the Embodiment 1 of the invention.

Next, operation will be described.

After an information bit sequence is input to the error correction encoder 11 of the transmitter 1, the error correction encoder 11 generates a parity bit sequence called parity bits from the information bit sequence, and outputs the information bit sequence and the parity bit sequence to the modulator 12.

Upon receiving the information bit sequence and the parity bit sequence from the error correction encoder 11, the modulator 12 of the transmitter 1 determines, in accordance with a rule provided by a pre-specified modulation scheme for multilevel modulation, I-ch and Q-ch coordinates on a two-dimensional plane corresponding to the information bit sequence and the parity bit sequence. After that, the modulator 12 maps transmission symbols onto the determined coordinates.

Figure 4:
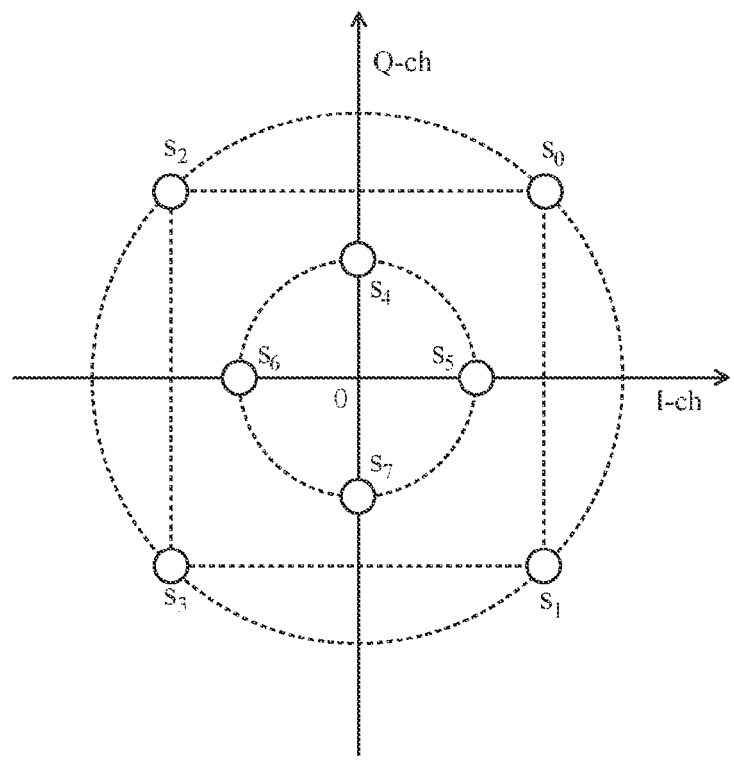
FIG. 4 is an illustrative diagram representing an example of constellation mapping in a case where a modulation scheme is 8QAM.
Figure 5:
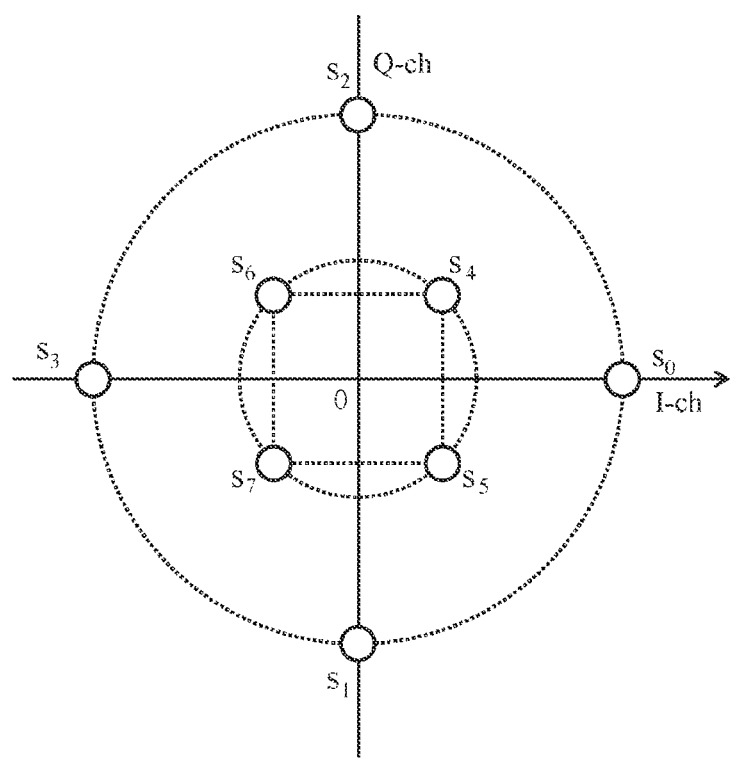
FIG. 5 is an illustrative diagram representing an example of constellation mapping in a case where a modulation scheme is 8QAM.

FIGS. 4 and 5 are illustrative diagrams representing examples of constellation mapping for a case where a modulation scheme is 8QAM. In FIGS. 4 and 5, s0 to s7 indicate transmission symbols.

Although here a case that the modulation scheme is 8QAM is exemplified, the modulation scheme is not limited to 8QAM.

The transmission symbols mapped by the modulator 12 are transmitted to the receiver 3 through the communication path 2. However, since the transmission symbols is influenced by noise in the communication path 2, coordinates of received symbols received by the receiver 3 may vary from coordinates of the transmission symbols.

After receiving a received symbol influenced by noise in the communication path 2, the demodulator 31 of the receiver 3 calculates, from the I-ch and Q-ch coordinates of the received symbol, an LLR which is a log-likelihood ratio of each of bits composing the received symbol.

The processing content of the demodulator 31 will be specifically described below.

First, the hard decision value calculator 41 of the demodulator 3 calculates hard decision values from the I-ch and Q-ch coordinates of a received symbol (step ST1 of FIG. 3).

A process of calculating a hard decision value is a publicly known technique and thus a detailed description thereof is omitted. For example, there is a method of identifying, from among all I-ch and Q-ch coordinates that can be taken by transmission symbols, coordinates of a transmission symbol closest to the I-ch and Q-ch coordinates of at received symbol, and deciding, as hard decision values, values of bits assigned to the transmission symbol closet to the received symbol.

The LLR calculator 42 approximately calculates, from the I-ch and Q-ch coordinates of the received symbol, LLRs to be used for soft decision decoding. Namely, approximate values of LLRs are calculated from the I-ch and Q-ch coordinates (step ST2).

In order to calculate accurate LLRs, although it is desirable to use the above-described equation (1), a large amount of computation is required, as mentioned above.

Hence, in order to reduce the amount of computation, the LLR calculator 42 uses the above-described equation (2) for approximately calculating LLRs.

Note that, for a method of approximately calculating LLRs, in addition to the method using equation (2), there is a method in which, instead of searching for a transmission symbol close to a received symbol, a transmission symbol is selected by other bases, and LLRs are approximately calculated based on the transmission symbol.

In addition, there is also a method of obtaining LLRs for I-ch and Q-ch coordinates by referring to a look-up table that records correspondence between I-ch and Q-ch coordinates and LLRs.

Here, a sign bit having a positive or negative value in the LLR indicates that a bit corresponding to this LLR, which is one of bits composing a received symbol, has a value of "0" or "1". An absolute value of the LLR represents a degree of reliability.

After the hard decision value calculator 41 calculates the hard decision values and the LLR calculator 42 approximately calculates the LLRs, the LLR corrector 43 determines whether there is a conflict between the hard decision values and the sign bits of the LLRs (step ST3).

For example, it is assumed that a sign bit of the LLR being positive indicates that a value of a bit corresponding to this LLR in the received symbol is "0", and also assumed that a sign bit of the LLR being negative indicates that a value of a bit corresponding to this LLR in the received symbol is "1". In this case, if the sign bit of the LLR is positive while the hard decision value is "1", it is determined that there is a conflict. Similarly, if the sign bit of the LLR is negative while the hard decision value is "0", it is determined that there is a conflict.

Although the case is shown in which a sign bit of the LLR being positive indicates that a value of a bit corresponding to this LLR in the received symbol is "0", and a sign bit of the LLR being negative indicates that a value of a bit corresponding to this LLR in the received symbol is "1", this is just one example. Alternatively, a sign bit of the LLR being positive may indicate that a value of a bit corresponding to this LLR in the received symbol is "1", and a sign bit of the LLR being negative may indicate that a value of a bit corresponding to this LLR in the received symbol is "0".

When determined that there is a conflict between the hard decision value and the sign bit of the LLR, the LLR corrector 43 inverts the sign bit of the LLR and outputs the sign-bit-inverted LLR as a soft decision value to the error correction decoder 32 (step ST4).

Specifically, if there is a conflict because the hard decision value is "1" while the sign bit of the LLR is positive, the LLR corrector 43 inverts the sign bit of the LLR from positive to negative, and outputs, as a soft decision value to the error correction decoder 32, the LLR composed of the sign bit indicating negative and an absolute value.

Similarly, if there is a conflict because the hard decision value is "0" while the sign bit of the LLR is negative, the sign bit of the LLR is inverted from negative to positive, and the LLR composed of the sign bit indicating positive and an absolute value is output as a soft decision value to the error correction decoder 32.

Note that, when a sign-bit-inverted LLR is output as a soft decision value, the absolute value (i.e., a degree of reliability) of the LLR may be changed or not be changed. However, it is desirable to enhance the error correction decoding performance of the error correction decoder 32 at the subsequent stage.

For example, there is a tendency to enhance the performance of soft decision decoding by setting the absolute value of the LLR to a minimum value.

If there is no conflict between the hard decision value and the sign bit of the LLR, the LLR corrector 43 outputs, as a soft decision value to the error correction decoder 32, the LLR being approximately calculated by the LLR calculator 42 (step ST5).

After receiving the soft decision values from the demodulator 31, the error correction decoder 32 performs soft decision decoding by using the soft decision values, and outputs an error-corrected information bit sequence (i.e., decoded bits) which is a result of the decoding.

Note that, since the soft decision decoding process using soft decision values itself is well known in the art, a detailed description thereof is omitted here.

As is clear from the above description, according to the Embodiment 1, there are provided the hard decision value calculator 41 that calculates hard decision values from the I-ch and Q-ch coordinates of a received symbol having been subjected to multilevel modulation; and the LLR calculator 42 that approximately calculates LLRs from the I-ch and Q-ch coordinates of the received symbol, and the LLR corrector 43 is configured to invert, when a sign bit of an LLR calculated by the LLR calculator 42 conflicts with a hard decision value calculated by the hard decision value calculator 41, the sign bit of the LLR and output the sign-bit-inverted LLR as a soft decision value to the error correction decoder 32. Therefore, an effect is achieved such that LLRs baying high approximation accuracy can be calculated with a small amount of computation.

Namely, according to the Embodiment 1, the LLR calculator 42 is configured to reduce the amount of computation of the LLRs by approximately calculating LLRs. In addition, since the LLRs are corrected by using hard decision values which can be calculated with a small amount of computation, the approximation accuracy of the LLRs can be increased. Accordingly, LLRs having high approximation accuracy can be calculated with a small amount of computation.

The Embodiment 1 discloses an example in which a modulation scheme is 8QAM. However, when a modulation scheme, such as QAM or APSK whose number of modulation levels is an odd power of 2, is used, an LLR for each of bits composing a received symbol likely depends on both of the I-ch coordinate and the Q-ch coordinate. Hence, calculation of approximate values of LLRs having high accuracy requires a large amount of computation.

In contrast, the Embodiment 1 is capable of reducing the amount of computation even when a modulation scheme is used such as QAM or APSK whose number of modulation levels is an odd power of 2. That is, when a received symbol is modulated by a modulation scheme, such as QAM or APSK, whose number of modulation levels is an odd power of 2, the LLR calculator 42 calculates approximate values of LLRs by using either the I-ch coordinates or Q-ch coordinates, each of which are the coordinates of the received symbol.

Specifically, when an approximate value of an LLR is calculated by using only the I-ch coordinates, the approximate value of an LLR is calculated by setting the Q-ch coordinates to "0".

Similarly, when an approximate value of an LLR is calculated by using only the Q-ch coordinates, the approximate value of an LLR is calculated by setting the I-ch coordinates to "0".

By performing the calculation mentioned above, even when as modulation scheme such as QAM or APSK whose number of modulation levels is an odd power of 2 is used, the amount of computation can be reduced. Also in this case, since the LLR corrector 43 corrects LLRs by using hard decision values which can be calculated with a small amount of computation, the approximation accuracy of the LLRs can be enhanced.

(Embodiment 2)

Figure 6:
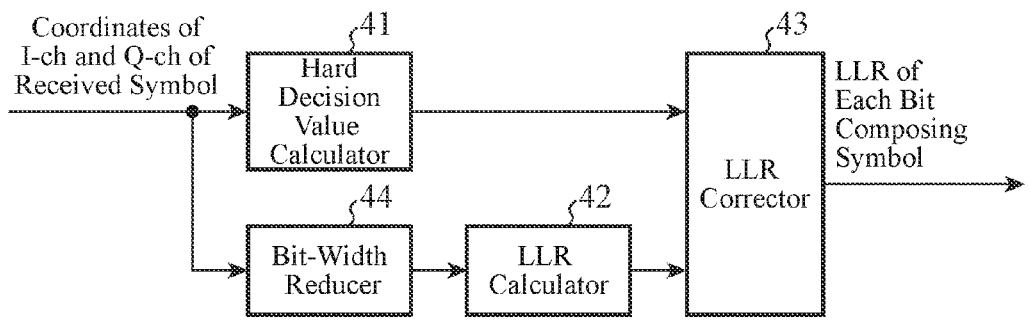
FIG. 6 is a configuration diagram representing a soft decision value generating apparatus according to Embodiment 2 of the invention.

FIG. 6 is a configuration diagram representing a soft decision value generating apparatus according to Embodiment 2 of the invention. In the drawing, the same reference signs as those in FIG. 1 denote the same or corresponding portions, and thus description thereof is omitted.

A bit-width reducer 44 is composed of, for example, a semiconductor integrated circuit having a CPU mounted thereon or a one-chip microcomputer. The bit-width reducer 44 performs a process of reducing the bit-widths of digital data representing the I-ch and Q-ch coordinates of a received symbol, and outputting, to an LLR calculator 42, the bit-width-reduced I-ch and Q-ch coordinates of the received symbol. Note that the bit-width reducer 44 corresponds to the claimed bit-width reducer.

The above-described Embodiment 1 teaches that the amount of computation is reduced by approximately calculating LLRs from the I-ch and Q-ch coordinates of a received symbol at an LLR calculator 42. In contrast, in the Embodiment 2, the bit-width reducer 44 is mounted in order to further reduce the amount of computation.

After receiving, the I-ch and Q-ch coordinates of a received symbol, the bit-width reducer 44 reduces the bit-widths of digital data representing the I-ch and Q-ch coordinates, and outputs the bit-width-reduced I-ch and Q-ch coordinates of the received symbol to the LLR calculator 42.

Specifically, when each of an I-ch coordinate and a Q-ch coordinate is input as "n" bit digital data the bit-widths of those digital data are reduced to "m" bits (m<n).

For a method of reducing bit-widths, the lower (n-m) bit(s) of digital data representing I-ch and Q-ch coordinates may be reduced, or the upper (n-m) bit(s) may be reduced by a clipping process.

An (n-m)-bit-reduced coordinate value v can be calculated depending, on a coordinate value "x" for I-ch and Q-ch coordinates (-2n<x<2n-1), as shown in the following equation (4).

(In the case of $x \geq 0$) \hfill (4)
$$y = \frac{x+a}{2^{n-m}}$$

(In the case of $x < 0$)
$$y = \frac{x-a}{2^{n-m}}$$

In equation (4), "a" denotes a constant that can be set arbitrarily, but is to be appropriately set according to the original bit-width "n" and the reduced bit-width "m". It is desirable to perform performance evaluation of an error correction decoder 32 by simulation or the like, and set "a" having a value at which the highest error correction performance is achieved.

Upon receiving the bit-width-reduced I-ch and Q-ch coordinates of the received symbol from the bit-width reducer 44. the LLR calculator 42 approximately calculates LLRs from the I-ch and Q-ch coordinates of the received symbol, in the same manner as the above-described Embodiment 1. However, since the bit-widths have been reduced, the amount of computation in an LLR approximation calculation process can be significantly reduced.

For example of the reduction, when a method is used, in which LLRs for I-ch and Q-ch coordinates are obtained by referring to a look-up table that records a correspondence between I-ch and Q-ch coordinates and LLRs, when the bit-widths of digital data representing the I-ch and Q-ch coordinates are reduced by one bit, the address width of the look-up table can be reduced by two bits. As a result, the size of the look-up table can be reduced to ¼.

Note that, if the bit-widths of digital data representing I-ch and Q-ch coordinates are reduced to extremely small bit-widths by increasing the reduced bit-widths at the bit-width reducer 44, approximation accuracy of LLRs calculated by the LLR calculator 42 may significantly degrade. In this case, even if correction is performed by an LLR corrector 43, sufficient approximation accuracy may not be obtained.

However, such situation occurs only when the bit-widths are reduced to extremely small bit-widths, such as when the bit-widths of digital data representing I-ch and Q-ch coordinates are reduced to two bits.

Although it depends on the number of levels of a modulation scheme, when the bit-widths of digital data after a bit-width reduction are three bits or more, such significant degradation of approximation accuracy does not occur. Note, however, that the bit-widths of digital data after a bit-width reduction need to be larger for a larger number of levels of a modulation scheme.

As mentioned, above, a demodulator 31 may have an equalizer or the like mounted thereon, in addition to the soft decision value generating apparatus. Such equalizer requires I-ch and Q-ch coordinates of a received symbol, which have a large bit-width.

Since the LLR calculator 42 of the Embodiment 1 may be installed at a subsequent stage to the equalizer, the bit-widths of I-ch and Q-ch coordinates are often large. Therefore, even if the bit-widths are reduced to a certain extent, the approximation accuracy of LLRs does not significantly degrade.

It is desirable to implement performance evaluation of the error correction decoder 32 by simulation or the like, and set a bit-width for reduction having a value at which high error correction performance is achieved. It is also desirable to determine such value by measuring the amount of computation reduced by a bit reduction and a circuit size.

The amount of reduction in the amount of computation in an LLR approximation calculation process, which results from a bit-width reduction, performed by the LLR calculator 42 is larger than the amount of computation in a bit-width reduction process performed by the bit-width reducer 44. Therefore, the overall amount of computation of the soft decision value generating apparatus is reduced. As a result, if comparing with the above-described Embodiment 1, the amount of computation can be further reduced and limber miniaturization of a circuit can be achieved.

(Embodiment 3)

Figure 7:
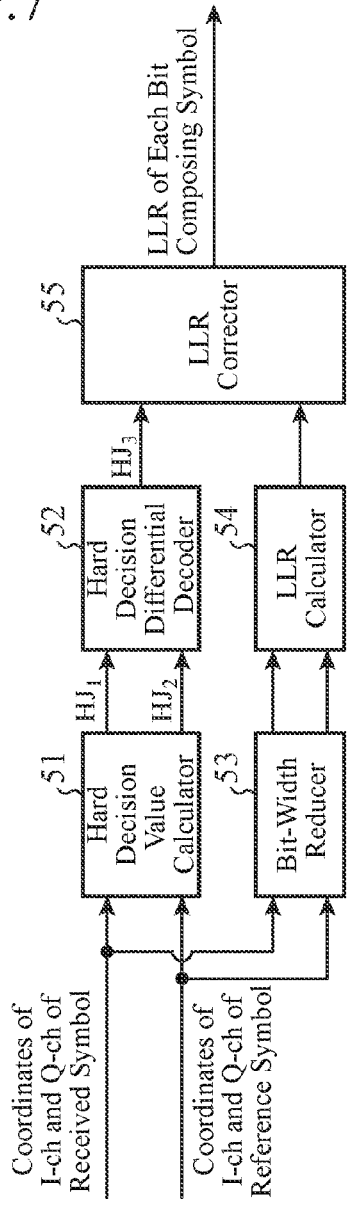
FIG. 7 is a configuration diagram representing a soft decision value generating apparatus according to Embodiment 3 of the invention.

FIG. 7 is a configuration diagram representing a soft decision value generating apparatus according to Embodiment 3 of the invention.

In Fig. 7, a hard decision value calculator 51 performs a process of calculating hard decision values $HJ_1$ from the I-ch and Q-ch coordinates of a received symbol, and calculating hard decision values $HJ_2$ from the I-ch and Q-ch coordinates of a reference symbol being a received symbol which has been received one time previous to the present time. Note that the hard decision value calculator 51 corresponds to the claimed hard decision value calculator.

A hard decision differential decoder 52 performs a process of performing hard decision differential decoding by using the hard decision values $HJ_1$ and $HJ_2$, which are calculated by the hard decision value calculator 51, and thereby calculating differentially decoded hard decision values $HJ_3$. Note that the hard decision differential decoder 52 corresponds to the claimed hard decision differential decoder.

A bit-width reducer b 53 performs a process of reducing the bit-widths of digital data representing the I-ch and Q-ch coordinates of the received symbol and also reducing the bit-widths of digital data representing the I-ch and Q-ch coordinates of the reference symbol. After that, the bit-width reducer 53 outputs, to an LLR calculator 54, the bit-width-reduced I-ch and Q-ch coordinates of the received symbol and the bit-width-reduced I-ch and Q-ch coordinates of the reference symbol. Note that the bit-width reducer 53 corresponds to the claimed bit-width reducer.

The LLR calculator 54 performs a process of approximately calculating LLRs to be used for soft decision decoding from the bit-width-reduced I-ch and Q-ch coordinates of the received symbol and the bit-width-reduced I-ch and Q-ch dinates of the reference symbol, which are output from the bit-width reducer 53. Note that the LLR calculator 54 corresponds to the claimed approximate value calculator.

An LLR corrector 55 performs a process of inverting a sign bit of an LLR calculated b the LLR calculator 54 in a case where the sign bit of the LLR conflicts with a differentially decoded hard decision value $HJ_3$ calculated by the hard decision differential decoder 52 and outputting the sign-bit-Inverted LLR as a soft decision value to an error correction decoder 32. Note that the LLR corrector 55 corresponds to the claimed approximate value corrector.

Although, in an example represented by FIG. 7, it is assumed that each of the hard decision value calculator 51, the hard decision differential decoder 52, the bit-width reducer 53, the LLR calculator 54, and the LLR corrector 55 which are components of the soft decision value generating apparatus is composed of dedicated hardware (e.g., a semiconductor integrated circuit having a CPU mounted thereon, or a one-chip microcomputer), the soft decision value generating apparatus may be composed of a computer.

When the soft decision value generating apparatus is composed of a computer, a program that describes the processing contents of the hard decision value calculator 51, the hard decision differential decoder 52, the bit-width reducer 53, the LLR. calculator 54, and the LLR corrector 55 is stored in a memory of the computer, and a CPU of the computer executes the program stored in the memory.

Figure 8:
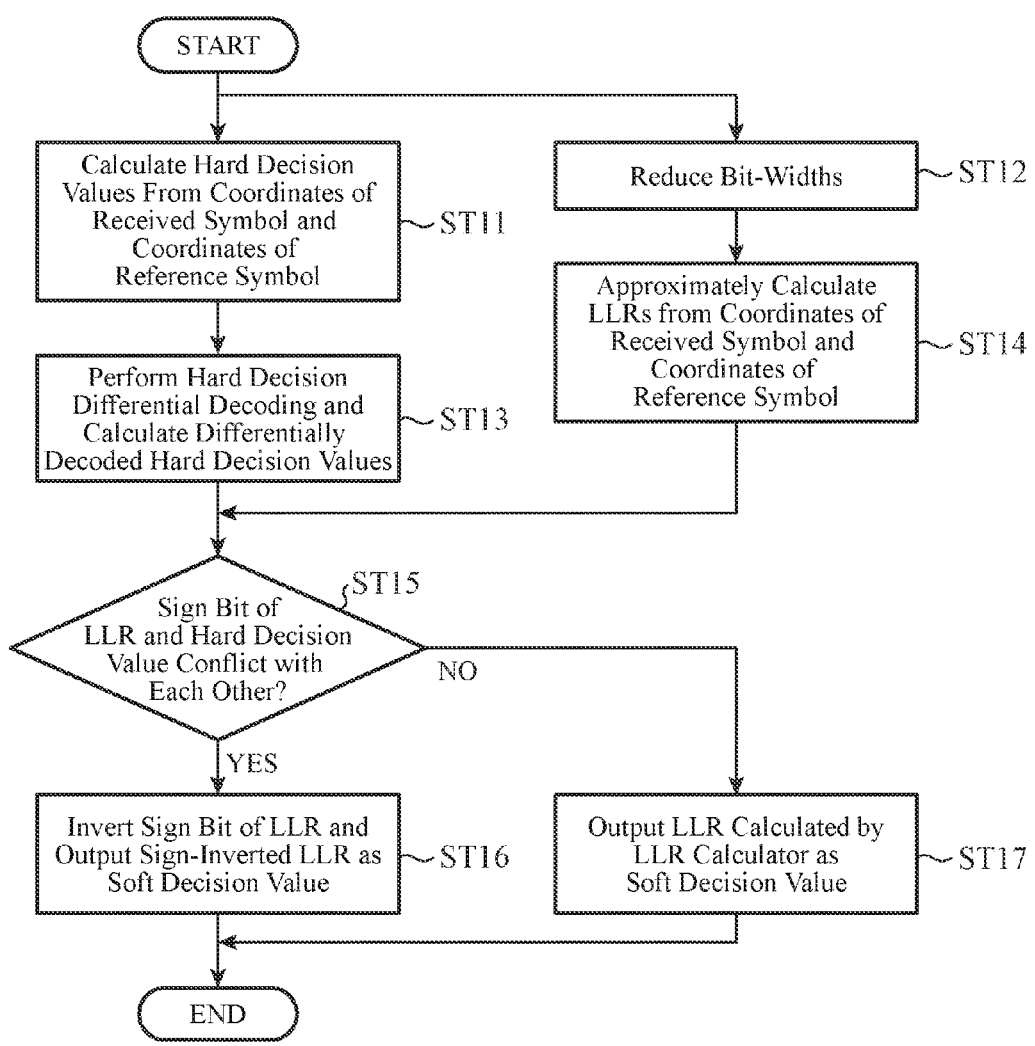
FIG. 8 is a flowchart representing the processing content of the soft decision value generating apparatus (or a method of generating soft decision values) according to the Embodiment 3 of the invention.

FIG. 8 is a flowchart representing the processing content of the soft decision value generating apparatus (a method of generating soft decision values) according to the Embodiment 3 of the invention.

Next, operation will be described.

In the Embodiment 3, it is, assumed that a received symbol is modulated by a modulation scheme involving differential encoding.

After receiving a received symbol having been differentially encoded by the modulator 12 of the transmitter as with the hard decision value calculator 41 of FIG. 2, the hard decision value calculator 51 calculates hard decision values $HJ_1$ from the I-ch and Q-ch coordinates of the received symbol (step ST11 of FIG. 8).

In addition, after receiving a reference symbol being a received symbol which has been received one time previous to the present time, as with the case of the received symbol, the hard decision value calculator 51 calculates hard decision values $HJ_2$ from the I-ch and Q-ch coordinates of the reference symbol (step STI11).

Upon receiving the received symbol having been differentially encoded by the modulator 12 of the transmitter 1, as with the bit-width reducer 44 of FIG. 6, the bit-width reducer 53 reduces the bit-widths of digital data representing the I-ch and Q-ch coordinates of the received symbol (step ST12).

In addition, upon receiving the reference symbol the bit-width reducer 53 reduces the bit-widths of digital data representing the I-ch and Q-ch coordinates of the reference symbol (step ST12), as with the case of the received symbol.

The bit-width reducer 53 independently performs a bit-width reduction process for the coordinates of the received symbol and a bit-width reduction process for the coordinates of the reference symbol. Alternatively, by rotating the reference symbol and the received symbol at the same angle depending on the coordinates of the reference symbol, the bit-widths can be reduced without deterioration of bit accuracy.

In a case where differential encoding is performed by using a difference between a phase of the reference symbol (i.e., an angle between a line segment connecting the symbol and an origin and an I-ch axis) and a phase of a transmission symbol, transformation, such as rotation, can be performed on the coordinates of the reference symbol and the received symbol without changing the phase difference.

For example, assuming that the modulator 12 of the transmitter 1 performs differential encoding with a phase difference between a reference symbol and a transmission symbol being 90-degrees, the reference symbol is rotated to be located in the first quadrant with respect to a received reference symbol and a received symbol. At that time, as described above, by also rotating the received symbol at the same angle, the phase difference is maintained and thus calculation of LLRs does not suffer any trouble.

The rotated reference symbol is always located in the first quadrant and sign bits indicating whether an I-ch coordinate and a Q-ch coordinate are positive or negative are always 0, and thus, there is no problem in reducing the sign bits. Hence, each of the I-ch and Q-ch coordinates of the reference symbol can be reduced by one bit without deterioration of bit accuracy.

For a modulation scheme where such differential encoding is performed, there is, for example, differential encoding QPSK (DQPSK). In addition, BPSK, 8QAM, 16QAM, etc., also have 90-degree or 180-degree differential encoding methods and thus a bit-width reduction by this operation is possible.

After the hard decision value calculator 51 calculates the hard decision values $HJ_1$ and $HJ_2$, the hard decision differential decoder 52 performs hard decision differential decoding that uses the hard decision values $HJ_1$ and $H_2$ in accordance with a rule of the differential encoding performed by the modulator 12 of the transmitter 1, and thereby calculates differentially decoded hard decision values $HJ_3$ (step ST13).

For example, if the modulator 12 determines a phase of a transmission symbol based on a relationship between a phase of a reference symbol and a bit string to be transmitted, differential decoding can be performed by using a phase difference between a received symbol and the reference symbol. Decoding can also be performed after performing rotation such as that described in the bit-width reduction process by the bit-width reducer 53.

In any case, the present configuration is implementable by using a differential decoding method that is not contradictory to the process performed by the modulator 12 of the transmitter 1. For hard decision differential decoding, since the process is performed by a hard decision, the amount of computation is small. Particularly, the amount of computation is as small as a non-problematic level compared to calculation of LLRs.

After receiving, from the bit-width reducer 53, the bit-width-reduced I-ch and Q-ch coordinates of the received symbol and the bit-width-reduced I-ch and Q-ch coordinates of the reference symbol, the LLR calculator 54 approximately calculates LLRs to be used for soft decision decoding, from the bit-width-reduced I-ch and Q-ch coordinates of the received symbol and the bit-width-reduced I-ch and Q-ch coordinates of the reference symbol (step ST14).

By computing the above-described equation (3), LLRs can be calculated even if the received symbol is differentially encoded. However, because the amount of computation of equation (3) is enormous, LLRs are approximately calculated.

For an example of a specific approximate computation method of equation (3), there is a method such as that disclosed in the above-described Patent Literature 2, in addition, as a method similar to the method disclosed in Patent Literature 2, a method of calculating LLRs by narrowing down candidates for a transmission symbol can also be used.

Moreover, here is also a method of obtaining LLRs for I-ch and Q-ch coordinates by referring to a look-up table that records a correspondence between the I-ch and Q-ch coordinates of received symbols and reference symbols and LLRs. In this method, comparing with the above-described Embodiments 1 and 2, the address width of the look-up table enlarges and thus the size of the look-up table enlarges. However, since a bit-width reduction process is performed by the bit-width reducer 53, the enlargement of the table size can be suppressed.

Any of the methods is applicable as long as the method can obtain certain approximation accuracy by correction performed by the LLR corrector 55 at the subsequent stage.

Note that, in order to reduce the amount of computation even when a modulation scheme is used such as QAM or APSK whose number of modulation levels is an odd power of 2, as with an LLR calculator 42 of FIG. 2, the LLR calculator 54 calculates approximate values of LLRs by using either the I-ch coordinate or the Q-ch coordinate of the coordinates of the received symbol when the received symbol is modulated by the modulation scheme such as QAM or APSK whose number of modulation levels is an odd power of 2.

After the hard decision differential decoder 52 calculates the hard decision values $HJ_3$ and the LLR calculator 54 approximately calculates the LLRs, the LLR corrector 55 determines whether there is a conflict between the hard decision values $HJ_3$ and sign bits of the LLRs (step ST15).

For example, it is assumed that a sign bit of the LLR being positive indicates that a value of a bit corresponding to this LLR in the received symbol is "0", and a sign bit of the LLR being negative indicates that a value of a bit corresponding to this LLR in the received symbol is "1". In this case, if the sign bit of the LLR is positive while the hard decision value is "1", it is determined that there is a conflict. Similarly, if the sign bit of the LLR is negative while the hard decision value is "0", it is determined that there is a conflict.

Although the case is shown in which a sign bit of the LLR being positive indicates that a value of a bit corresponding to this LLR in the received symbol is "0", and a sign bit of the LLR being negative indicates that a value of the bit a bit corresponding to this LLR in the received symbol is "1", this is just one example. Alternatively, a sign bit of the LLR being positive may indicate that a value of a bit corresponding to this LLR in the received symbol is "1", and a sign bit of the LLR being negative may indicate that a value of a bit corresponding to this LLR in the received symbol is "0".

When determined that there is a conflict between the hard decision value $HJ_3$ and the sign bit of an LLR, the LLR corrector 55 inverts the sign bit of the LLR and outputs the sign-bit-inverted LLR as a soft decision value to the error correction decoder 32 (step ST16).

Specifically if there is a conflict because the hard decision value is "1" while the sign bit of the LLR is positive, the LLR corrector 55 inverts the sign bit of the LLR from positive to negative, and outputs, as a soft decision value to the error correction decoder 32, the LLR composed of the sign bit indicating negative and an absolute value.

Similarly, if there is a conflict because the hard decision value is "0" while the sign bit of the LLR is negative, the sign bit of the LLR is inverted from negative to positive, and the LLR composed of the sign bit indicating positive and an absolute value is output as a soft decision value to the error correction decoder 32.

Note that, when a sign-bit-inverted LLR is output as a soft decision value, the absolute value (i.e., a degree of reliability) of the LLR may be changed or not be changed. However, it is desirable to enhance the error correction decoding performance of the error correction decoder 32 at the subsequent stage.

For example, there is a tendency to enhance the performance of soft decision decoding by setting the absolute value of the LLR to a minimum value.

If there is no conflict between the hard decision value $HJ_3$ and the sign bit of the LLR, the LLR corrector 55 outputs, as a soft decision value to the error correction decoder 32, the LLR being approximately calculated by the LLR calculator 54 (step ST17).

As is clear from the above, according to the Embodiment 3, there are provided the hard decision value calculator 51 that calculates hard decision values $HJ_1$ from the I-ch and Q-ch coordinates of a received symbol, and calculates hard decision values $HJ_2$ from the I-ch and Q-ch coordinates of a reference symbol; the hard decision differential decoder 52 that performs hard decision differential decoding by using the hard decision values $HJ_1$ and $HJ_2$ calculated by the hard decision value calculator 51, and thereby calculates differentially decoded hard decision values $HJ_3$, and the LLR calculator 54 that approximately calculates LLRs to be used for soft decision decoding, from bit-width-reduced I-ch and Q-ch coordinates of the received symbol and bit-width-reduced I-ch and Q-ch coordinates of the reference symbol output from the bit-width reducer 53, and the LLR corrector 55 is configured to invert, when a sign bit of an LLR calculated by the LLR calculator 54 conflicts with a differentially decoded hard decision value $HJ_3$ calculated by the bard decision differential decoder 52, the sign bit of the LLR and output the sign-bit-inverted LLR as a soft decision value to the error correction decoder 32. Therefore, even when a modulation scheme involving differential encoding is used, an effect is achieved such that LLRs having high approximation accuracy can be calculated with a small amount of computation.

Note that, according to the Embodiment 3, unlike the above-described Patent Literature 2, LLRs having high accuracy can be calculated with a small amount of computation for modulation schemes other than QPSK. Needless to say, this effect can also be obtained for 8QAM shown in FIGS. 4 and 5.

(Embodiment 4)

In the above-described Embodiment 3, description is made to assume that all bits composing a received symbol are differentially encoded. Alternatively, there is a case that only a part of a plurality of bits composing a received symbol is differentially encoded.

For example, if a received symbol is composed of three bits, there may be a case that only the upper two bits are differentially encoded while the lower one bit is not differentially encoded.

Figure 9:
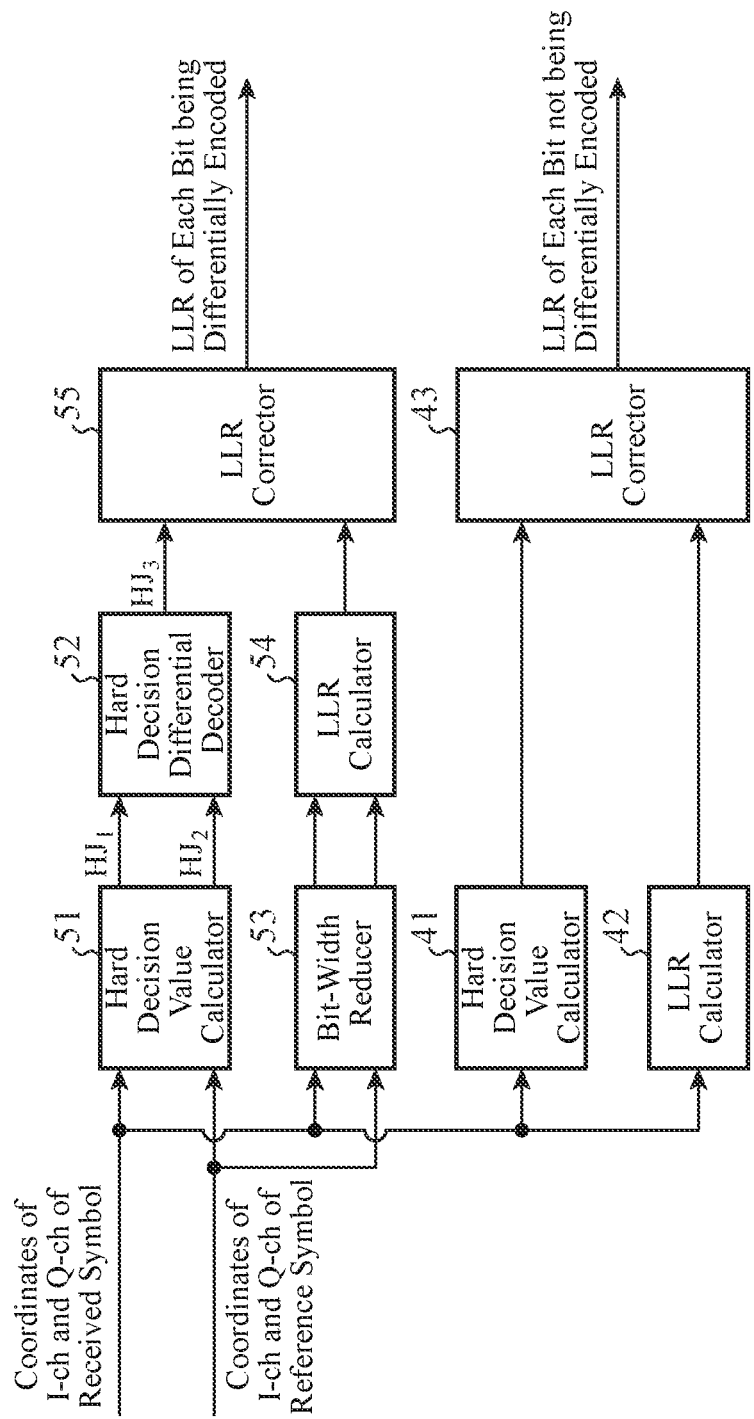
FIG. 9 is a configuration diagram representing a soft decision value generating apparatus according to Embodiment 4 of the invention.

FIG. 9 depicts a soft decision value generating apparatus applicable to a case that only a part of a plurality of bits composing a received symbol is differentially encoded.

In addition to a hard decision value calculator 51, a hard decision differential decoder 52, a bit-width reducer 53, an LLR calculator 54, and an LLR corrector 55 of FIG. 7 in the above-described Embodiment 3, the soft decision value generating apparatus of FIG. 9 includes a hard decision value calculator 41, an LLR calculator 42, and an LLR corrector 43 of FIG. 2 in the above-described. Embodiment 1.

In the Embodiment 4, the hard decision value calculator 41, the LLR calculator 42, and the LLR corrector 43 compose the claimed log-likelihood ratio calculator.

In an example of FIG. 9, although a bit-width reducer 44 is not provided, this bit-width reducer 44 can be provided at a previous stage to the LLR calculator 42.

In the soft decision value generating apparatus of FIG. 9, the coordinates of a bit of a received symbol that is differentially encoded are accepted together with the coordinates of a reference symbol by the hard decision value calculator 51 and the bit-width reducer 53. In this case, the same process as that of the above-described Embodiment 3 is performed.

On the other hand, the coordinates of a bit of the received symbol that is not differentially encoded is accepted by the hard decision value calculator 41 and the LLR calculator 42. In this case, the same process as that of the above-described Embodiment 1 is performed.

Accordingly, even when only a part of a plurality of bits composing a received symbol is differentially encoded, LLRs having high approximation accuracy can be calculated with a small amount of computation.

Note that free combination of the embodiments, or modifications to any component of the embodiments, or omission of any component of the embodiments may be made without departing from the spirit and scope of the invention.

The soft decision value generating apparatus according to the invention includes an approximate value corrector that inverts, in a case where a sign bit of an approximate value calculated by an approximate value calculator conflicts with a hard decision value calculated by a hard decision value calculator, the sign bit of the approximate value and outputs the sign-bit-inverted approximate value as a soft decision value, and thus, LLRs having high approximation accuracy can be calculated with a small amount of computation. Accordingly, the soft decision value generating apparatus is suitable for use for data error correction in a digital communication system.

REFERENCE SIGNS LIST

1: Transmitter, 2: Communication path. 3: Receiver, 11: Error correction encoder, 12: Modulator, 31: Demodulator, 32: Error correction decoder, 41: Hard decision value calculator (Hard decision value calculator and Log-likelihood ratio calculator), 42: LLR calculator (Approximate value calculator and Log-likelihood ratio calculator), 43: LLR corrector (Approximate value corrector and Log-likelhood ratio calculator), 44: Bit-width reducer (Bit-width reducer), Si: Hard decision value calculator (Hard decision value calculator. 52: Hard decision differential decoder (Hard decision differential decoder), 53: Bit-width reducer (bit-width reducer), 54: LLR calculator (Approximate value calculator), and 55: LLR corrector (Approximate value corrector)

The invention claimed is:

1. An apparatus comprising:
   a hard decision value calculator to calculate hard decision values from coordinates of a received symbol having been subjected to multilevel modulation;
   an approximate value calculator to calculate, from the coordinates of the received symbol, approximate values of log-likelihood ratios to be used for soft decision decoding; and
   an approximate value corrector to
   determine whether there is a conflict between a sign bit of an approximate value calculated by the approximate value calculator and a hard decision value calculated by the hard decision value calculator,
   invert the sign bit of the approximate value in a case where it is determined that there is the conflict between the sign bit of the approximate value and the hard decision value, and
   output the sign-bit-inverted approximate value as a soft decision value.

2. The apparatus according to claim 1, wherein, in a case where the received symbol is modulated by a modulation scheme whose number of modulation levels is an odd power of 2, the approximate value calculator calculates the approximate values of the log-likelihood ratios by using either in-phase component coordinates or quadrature component coordinates, each of which are coordinates of the received symbol.

3. The apparatus according to claim 1, further comprising a bit-width reducer to reduce bit-widths of digital data representing the coordinates of the received symbol, and to output the bit-width-reduced coordinates of the received symbol to the approximate value calculator.

4. The apparatus according to claim 1, further comprising a hard decision differential decoder to perform hard decision differential decoding by using a plurality of hard decision values calculated by the hard decision value calculator, and to calculate differentially decoded hard decision values,
wherein:
the hard decision value calculator calculates hard decision values from coordinates of a received symbol having been subjected to multilevel modulation through a modulation scheme performing differential encoding, and calculates hard decision values from coordinates of a reference symbol being a received symbol which has been received prior to a present time;
the hard decision differential decoder performs the hard decision differential decoding by using, as the plurality of the hard decision values, the hard decision values calculated from the coordinates of the received symbol and the hard decision values calculated from the coordinates of the reference symbol by the hard decision value calculator;
the approximate value calculator calculates, from the coordinates of the received symbol and the coordinates of the reference symbol, approximate values of log-likelihood ratios to be used for soft decision decoding; and
the approximate value corrector inverts a sign bit of an approximate value, calculated by the approximate value calculator, in a case where the sign bit of the approximate value conflicts with a differentially decoded hard decision value calculated by the hard decision differential decoder, and outputs the sign-bit-inverted approximate value as the soft decision value.

5. The apparatus according to claim 4, wherein, in a case where the received symbol is modulated by a modulation scheme whose number of modulation levels is an odd power of 2, the approximate value calculator calculates the approximate values of the log-likelihood ratios by using either in-phase component coordinates or quadrature component coordinates, each of which are coordinates of the received symbol and the coordinates of the reference symbol.

6. The apparatus according to claim 4, further comprising a bit-width reducer to reduce bit-widths of digital data representing the coordinates of the received symbol and also reduce bit-widths of digital data representing the coordinates of the reference symbol, and to output, to the approximate value calculator, the bit-width-reduced coordinates of the received symbol and the bit-width-reduced coordinates of the reference symbol.

7. The generating apparatus according to claim 4, wherein a plurality of bits composing the received symbol includes a bit on which differentially encoding has been performed and a bit on which differentially encoding has not been performed, and
the approximate value corrector
outputs a soft decision value based on a hard decision value and an approximate value, each of which is obtained from the bit on which differentially encoding has been performed, and
outputs a soft decision value based on a hard decision value and an approximate value, each of which is obtained from the bit on which differentially encoding has not been performed.

8. A method of generating soft decision values, the method comprising:
a hard decision value calculation processing step of calculating hard decision values from coordinates of a received symbol having been subjected to multilevel modulation;
an approximate value calculation processing step of calculating, from the coordinates of the received symbol, approximate values of log-likelihood ratios to be used for soft decision decoding; and
an approximate value correction processing step of
determining whether there is a conflict between a sign bit of an approximate value calculated by the approximate value calculation processing step and a hard decision value calculated by the hard decision value calculation processing step,
inverting the sign bit of the approximate value in a case where it is determined that there is the conflict between the sign hit of the approximate value and the hard decision value, and
outputting the sign-bit-inverted approximate value as a soft decision value.

9. The method of generating soft decision values according to claim 8, further comprising a hard decision differential decoding processing step of performing hard decision differential decoding by using a plurality of hard decision values calculated by the hard decision value calculation processing step, and calculating differentially decoded hard decision values,
wherein:
the hard decision value calculation processing step includes calculating hard decision values from coordinates of a received symbol having been subjected to multilevel modulation through a modulation scheme performing differential encoding, and calculating hard decision values from coordinates of a reference symbol being a received symbol which has been received one time previous to a present time;
the hard decision differential decoding processing step includes performing hard decision differential decoding by using, as the plurality of the hard decision values, the hard decision values calculated from the coordinates of the received symbol and the hard decision values calculated from the coordinates of the reference symbol in the hard decision value calculation processing step;
the approximate value calculation processing step includes calculating, from the coordinates of the received symbol and the coordinates of the reference symbol, approximate values of log-likelihood ratios to be used for soft decision decoding; and
the approximate value correction processing step includes inverting a sign bit of an approximate value calculated by the approximate value calculation processing step, in a case where the sign bit of the approximate value conflicts with a differentially decoded hard decision value calculated by the hard decision differential decoding processing step, and outputting the sign-bit-inverted approximate value as the soft decision value.

* * * * *